United States Patent [19]

Pfeifer et al.

[11] Patent Number: 4,947,171
[45] Date of Patent: Aug. 7, 1990

[54] CIRCUIT ARRANGEMENT FOR AVERAGING SIGNALS DURING PULSE-DENSITY D/A OR A/D CONVERSION

[75] Inventors: Heinrich Pfeifer, Denzlingen; Werner Reich, Emmendingen; Ulrich Theus, Gundelfingen, all of Fed. Rep. of Germany

[73] Assignee: Deutsche ITT Industries GmbH, Freiburg, Fed. Rep. of Germany

[21] Appl. No.: 321,593

[22] Filed: Mar. 10, 1989

[30] Foreign Application Priority Data

Mar. 31, 1988 [EP] European Pat. Off. ........ 88105242.7

[51] Int. Cl.$^5$ ............................................. H03M 1/00
[52] U.S. Cl. .................................... 341/143; 341/126; 375/23
[58] Field of Search ................... 341/126, 53, 76, 143, 341/144, 152, 155, 157; 323/317; 375/21–23, 25, 27, 122; 364/486; 370/8–10

[56] References Cited

U.S. PATENT DOCUMENTS

| 4,125,803 | 11/1978 | Van de Plassche . |
| 4,156,871 | 5/1979 | Lambourn . |
| 4,366,572 | 12/1982 | Takatsuki et al. .................... 375/37 |
| 4,559,602 | 12/1985 | Bates ................................... 364/487 |
| 4,712,217 | 12/1987 | McPherson .......................... 371/55 |
| 4,825,452 | 4/1989 | Wong .................................... 375/22 |

FOREIGN PATENT DOCUMENTS 2717042 11/1977 Fed. Rep. of Germany .
8605048 8/1986 PCT Int'l Appl. .

OTHER PUBLICATIONS

Heinrich Pfeifer, "Analog/Digital–Umsetzung mit einem Pulsdichtemodulator," (Analog/Digital–Conversion with a Pulse–density Modulator), *Elektronik*, No. 19, Sep. 20, 1985, pp. 75 to 77.
H. Deutsch, et al., "Digital Filter for Delta Demodulation," *IBM Technical Disclosure Bulletin*, vol. 10, No. 4, Sep. 1967, p. 370.
European Search Report, Application No. 88105242.7, Oct. 27, 1988.

*Primary Examiner*—William M. Shoop, Jr.
*Assistant Examiner*—Brian K. Young
*Attorney, Agent, or Firm*—Thomas L. Peterson

[57] ABSTRACT

In a pulse-density D/A or A/D converter, improved averaging of a pulse-density-modulated (PDM) signal in the presence of a jittering clock signal is achieved by applying the PDM signal to the serial input of an n-stage shift register whose parallel output serves to control n state signals. The shift register is driven by the clock signal. The n state signals are combined into a sum signal which feeds a low-pass filter. In preferred embodiments, the n state signals are weighted and/or isolated from the respective previous state and the following state by means of gate circuits.

13 Claims, 5 Drawing Sheets

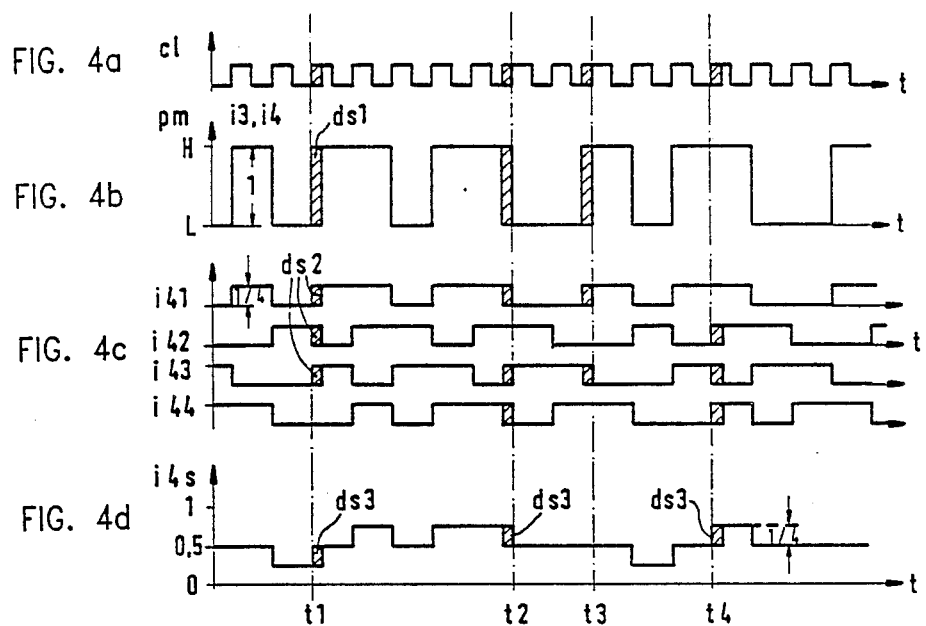
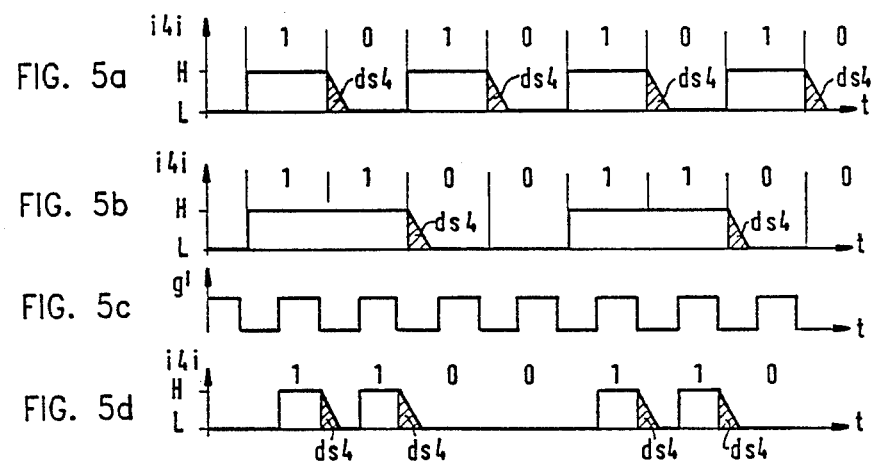

FIG. 6
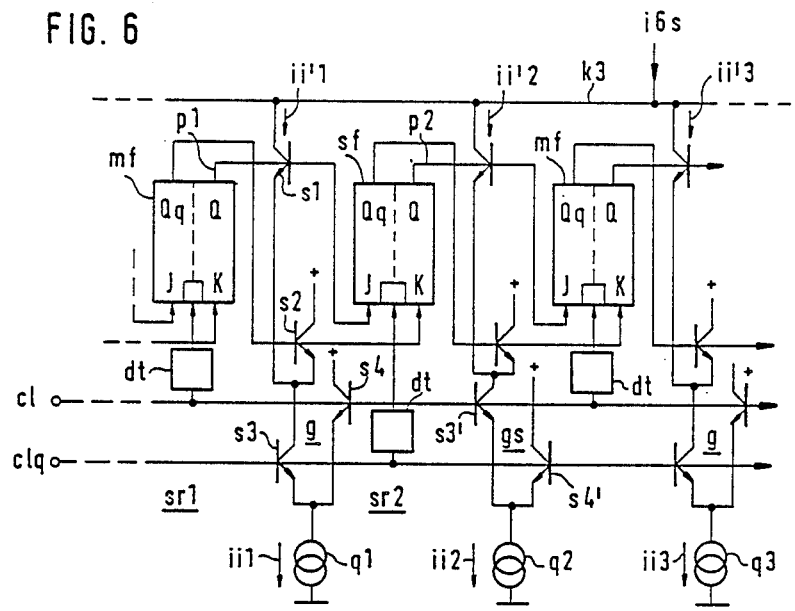
FIG. 7a cl
FIG. 7b clq
FIG. 7c p1
FIG. 7d p2
FIG. 7f ii'1
FIG. 7e ii'2
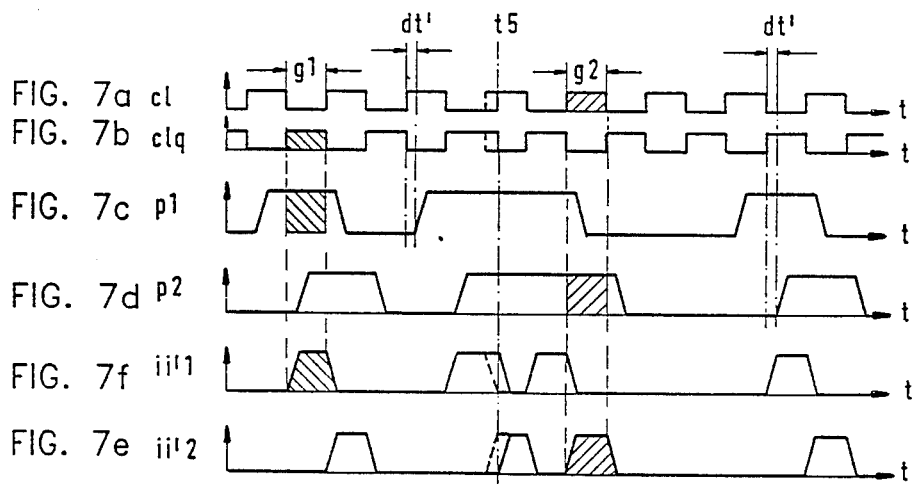

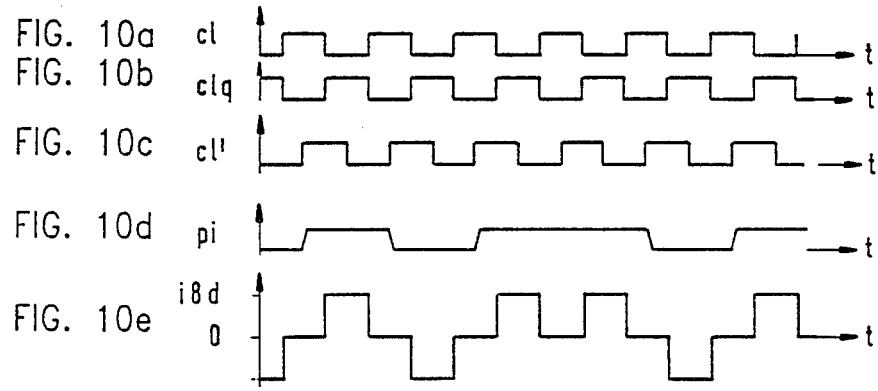
FIG. 10a cl
FIG. 10b clq
FIG. 10c cl'
FIG. 10d pi
FIG. 10e i8d
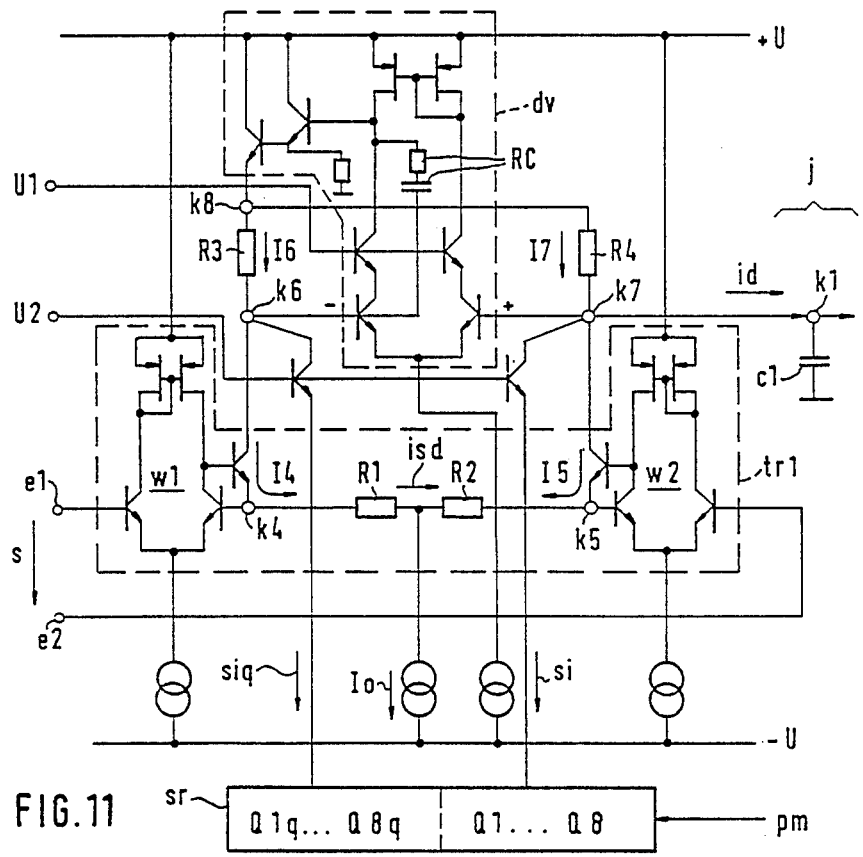
FIG. 11

1

CIRCUIT ARRANGEMENT FOR AVERAGING SIGNALS DURING PULSE-DENSITY D/A OR A/D CONVERSION

BACKGROUND OF THE INVENTION

1. Field of the Invention

The present invention relates to a circuit arrangement which changes a pulse-density-modulated signal ("PDM signal") into an analog signal corresponding to the time average of the PDM signal, thus, representing a digital-to-analog ("D/A") conversion of the PDM signal, depending on the degree of smoothing. Such circuit arrangements are used mainly in pulse-density analog-to-digital ("A/D") converters having sigma-delta modulators in their feedback paths.

2. Description of the Related Art

U.S. Pat. No. 4,156,871, for example, shows in FIG. 1 the circuit of a pulse-density A/D converter whose output, namely the PDM signal, is fed back through an averaging RC low-pass filter The capacitor of the RC low-pass filter is connected through a resistor to the input for the analog signal to be converted.

In "Analog/Digital-Umsetzung mit einem Pulsdichtemodulator," ("Analog/Digital-Conversion with a Pulse-density Modulator[1]), Elektronik, No. 19, Sept. 20, 1985, pp. 75 to 77, by Heinrich Pfeifer, further examples of pulse-density A/D or D/A converters are shown which contain sigma-delta modulators and at least one PDM-signal-averaging device including an RC low-pass filter or an integrator. In the Heinrich article, it is stated that the conversion of pulse-code-modulated signals ("PCM signals") into PDM signals by means of a digital pulse-density modulator is simple, and that, on the other hand, it is also readily possible to derive from the PDM signal a PCM signal with a lower sampling rate and a greater number of bits by means of a decimation filter (i.e., a digital low-pass filter), so that, via this PDM intermediate phase, an advantageous high-resolution D/A or A/D conversion is obtained for ordinary PCM signals. For an audio-signal bandwidth of 15 KHz and at a clock frequency of 4.5 MHz, for example, a theoretical signal-to-noise ratio of 85 dB is obtained, so that the maximum possible resolution is about 14 bits in the case of a binary number code.

The attainable resolution of the PDM signals during A/D and D/A conversion depends on the accuracy of the averaging. A particularly disturbing source of error is clock-signal jitter, which causes PDM-signal-edge jitter, which produces a noise signal superposed on the average value.

Auslegeschrift 27 17 042 (corresponding to U.S. Pat. No. 4,125,803) describes the use of a shift register in a D/A converter wherein the shift register is part of a current distribution circuit. The current distribution circuit provides a number of direct-current pairs which have highly accurate magnitude ratios that can be expressed in integers. By means of a switch arrangement controlled by the parallel output of the shift register, a first number and a second number of currents of the same magnitude are switched to a first summing point and a second summing point, respectively, with the shift register switching the individual currents at regular intervals in such a manner that during one cycle, all existing currents contribute to the summation the same number of times, and thus for the same period.

Since all currents are derived from a single current source by division, the deviations of the individual currents compensate each other in each complete cycle, which covers n clock periods During the cycle, the shift register is connected as a ring. The shift signal must be free of jitter. The circuit arrangement of Auslegeschrift 27 17 042 thus differs considerably from the subject matter of the present invention, as will be described below.

SUMMARY OF THE INVENTION

It is, therefore, the object of the invention as claimed to provide a circuit arrangement which makes it possible to average the PDM signal even in the presence of a jittering clock signal without changing the useful signal in its frequency range.

An important aspect of the present invention relates to the fact that the PDM signal, in addition to being averaged continuously as in conventional arrangements, is averaged within a time window tracking the signal over several clock periods in order to diminish the contribution of the time-shifted PDM-signal edges to the average. The additional averaging is performed by an n-stage shift register whose serial input is fed with the PDM signal and whose n-bit parallel output simultaneously provides the sequence of n PDM single-signal states. The jittering clock signal is used as the shift signal. The respective binary state of the n shift register stages determines the state of n state signals, with each of the n shift register stages having one state signal assigned to it. A summer combines all state signals into a sum signal which is averaged in the usual manner.

The additional averaging by means of the shift register and the state signals is particularly advantageous because the individual state signals can also be weighted differently. By this kind of weighting, the frequency characteristic of the noise component in the useful signal can be influenced in an advantageous manner, so that the noise component in the useful-frequency range, for example, will be additionally reduced at the expense of the frequency range lying outside that range.

In a preferred embodiment of the circuit arrangement according to the invention, each of the individual state signals is applied to the summer through a gate circuit which is open only during a short time interval of each shift clock period, namely during the steady state of the respective shift register stage. A shift register arrangement controlled by a multiphase clock signal permits a particularly advantageous configuration since the multiphase clock signal is also used to control the gate circuit. The gate circuit is easy to implement, and a further advantage is that, unlike with the well-known return-to-zero method, the clock-signal frequency need not be doubled by inserting an additional 0 (zero) behind each signal state.

By means of the gate circuit, the state signal fed to the summer is "isolated" from the previous state and the subsequent state without the average being affected by different leading or trailing edges of the respective state signal.

BRIEF DESCRIPTION OF THE DRAWINGS

The invention will now be explained in greater detail with reference to the accompanying drawings, in which:

FIG. 4c–4d shows seven typical signal waveforms that illustrate how the circuit arrangement of FIG. 2 reduces the effect of clock-signal jitter on the averaging;

FIG. 5a–5d shows schematically how different leading and trailing edges of the PDM signal interfere with the averaging and how the effect of the different leading and trailing edges can be eliminated;

FIG. 6 is a block diagram of an embodiment of multiphase-clock-controlled shift register stages having gate circuits individually associated therewith;

FIG. 7a–7f illustrate six typical signal waveforms in the arrangement of FIG. 6;

FIG. 10a–10e illustrate five typical signal waveforms in the gate circuit of FIG. 9; and FIG. 11 is a schematic circuit diagram of a transconductance amplifier which forms the difference signal to be integrated from the analog input signal and the sum signal.

DETAILED DESCRIPTION OF THE PREFERRED EMBODIMENT

Figure 1:
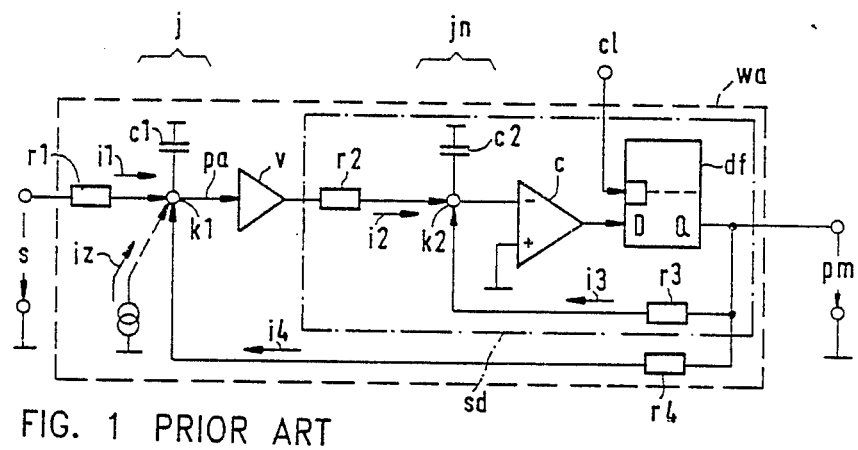
FIG. 1 is a block diagram of a prior-art pulse-density A/D with a sigma-delta modulator.

The pulse-density A/D converter wa, shown schematically, in FIG. 1 is in the prior art. It is described, for example, in the above-mentioned journal article by Heinrich Pfeifer in *Elektronik*. The pulse-density A/D converter wa is also referred to as a second-order sigma-delta modulator, because it includes two first-order low-pass filters or two first-order integrators j, jn as averaging devices, with the integrator j forming part of the external PDM feedback loop, and the sigma-delta integrator jn forming part of the internal PDM feedback loop. Higher-order integrators or low-pass filters must not be used in such A/D converters.

The pulse-density A/D converter wa receives an analog input signal s to be digitized and generates a digital output signal pm. The analog input signal s produces an intermediate signal i1 via a first resistor r1. The intermediate signal i1 is a current which is supplied to a first node k1. Also connected to the first node k1 are a first capacitor c1, an input of an amplifier v, and one terminal of a fourth resistor r4. The other terminal of the fourth resistor r4 is connected to the output for the PDM signal pm and to a third resistor r3. The input to the amplifier v from the first node k1 is a signal pa. The third resistor r3 and the fourth resistor r4 determine the magnitudes of an internal feedback signal i3 and an external feedback signal i4, respectively, which are fed to a second node k2 and to the first node k1, respectively. The second node k2 is connected to the output of the amplifier v through a second resistor r2, to the inverting (−) input of a comparator c, and to a second capacitor c2.

The second resistor r2 forms an input current i2 for a sigma-delta modulator sd from the output voltage of the amplifier v. Thus, the first node k1 and the first capacitor c1 represent an integrator j for the applied currents i1, i4, and the second node k2 and the second capacitor c2 represent an integrator jn for the applied currents i2, i3. The two currents i1 and i4 fed to the node k1 and the two currents i2 and i3 fed to the node k2 are summed in these nodes, but by taking suitable steps, their directions are determined such that the summation results in a subtraction, so that the integration relates only to the resulting difference current. By a suitable choice of the four resistors r1 . . . r4, the gain of the amplifier v, and the signal amplitudes at the input and output, the average current balance in the two nodes k1, k2 is even.

The noninverting input (+) of the comparator c is grounded, and the output of the comparator c is coupled to the D input of the D flip-flop df. The clock input of the D flip-flop df is controlled by a clock signal c1. The output of the D flip-flop df provides the PDM signal pm.

With respect to the analog input signal s and the PDM signal pm, the integrator j and the sigma-delta integrator jn represent only approximately ideal integrators, for they are actually RC low-pass filters with a very low cutoff frequency, namely less than 5 kHz for audio signals, for example. The required polarity of the signals fed to the two nodes k1, k2 can also be achieved by means of a different circuit configuration, such as by signal inversion at the D flip-flop df or at the comparator c, or by the use of inverting amplifiers.

Although the cutoff frequencies of the RC low-pass filters lie in the useful-frequency band, the useful frequency response is not affected. Since, on an average, the current balance in the first and second nodes k1, k2 is even, these nodes represent very slowly tracking potentials for the input signal and the feedback signal, so that to a first degree of approximation, the capacitors c1, c2 have no effect on the signal path in the useful-frequency band.

Another possibility of settling the current balance in the two nodes k1, k2 is to apply an additional signal iz which is constant on the average. In FIG. 1, the signal iz is fed from a current source to the first node k1 as illustrated by the dashed line. This may be necessary, for example, if the analog input signal s is symmetrical with respect to ground, while the two states of the D flip-flop df are asymmetrical with respect to ground.

If the clock signal c1 exhibits jitter, the edges of the PDM signal pm will jitter, too, and a noise signal caused by this jitter will be superposed on the averaging or integration of the PDM signal fed back to the two nodes k1, k2. The averaging in the external feedback loop is especially critical. The internal feedback loop is not so critical because in it, only the low-pass-filtered error signal is digitized, whose contribution is correspondingly small, so that the required averaging accuracy need not be high. The "error signal" is the difference current formed in the first node k1, which is usually small. The resolution of the PDM A/D converter wa thus depends essentially on the accuracy of the signal pa averaged in the integrator j.

Figure 2:
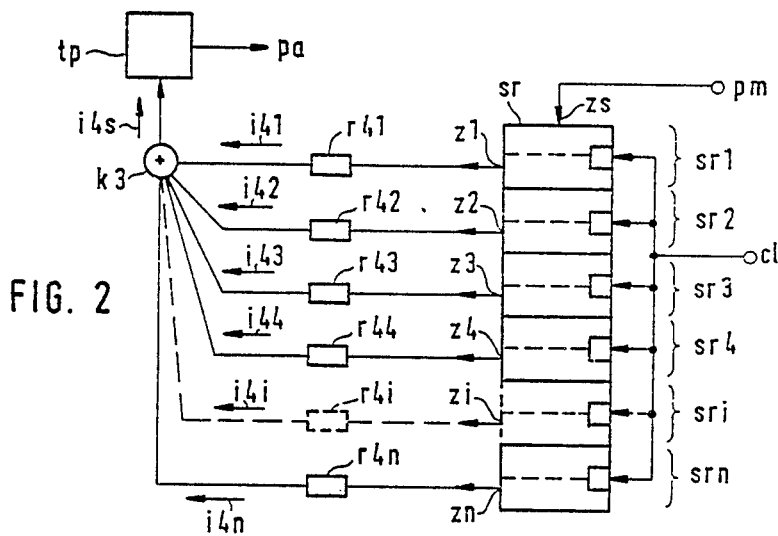
FIG. 2 is a block diagram of a simple embodiment of the circuit arrangement according to the invention with an n-stage shift register.

FIG. 2 is block diagram of a simple embodiment of the circuit arrangement of the present invention for averaging the PDM signal pm. The circuit shown in the block diagram comprises an n-stage shift register sr, a summer k3, and a low-pass filter tp. The n-stage shift register sr has n shift register stages sr1 . . . srn which are controlled by the clock signal c1. The shift register stages sr1 . . . srn are illustrated schematically as flipflop circuits for simplicity, but they are not limited to such circuits.

The shift register sr has a serial input zs which is fed with the PDM signal pm. The parallel output of the shift register sr comprises individual shift register stage outputs z1 . . . zn from the shift register stages sr1 . . . srn. The outputs z1 . . . zn are connected to resistors r41 . . . r4n, respectively, which convert the low output potentials of the individual shift register stages into currents representing the respective states of these stages, and thus produce n state signals i41 . . . i4n. The state signals i41 . . . i4n are applied to the summer k3, which, in the simplest case, is a node which combines the individual currents supplied to it and provides a sum signal i4s to the low-pass filter tp. The low-pass filter tp provides the average signal pa which, if sufficiently filtered, is the reconverted PDM signal. In a complete PDM D/A converter, unlike in the PDM A/D converter of FIG. 1, the passband of the low-pass filter tp, which is preferably a higher-order low-pass filter, extends at least over the entire bandwidth of the useful signal.

The tracking time window described above is formed by the n shift register stages sr1 . . . srn, whose n outputs z1 . . . zn can be tapped simultaneously for further averaging. If the output potentials of the n shift register stages sr1 . . . srn are alike in one state or the other, and the resistors r41 . . . r4n are of the same value, the respective state signals i41 . . . i4n are also alike. Suitable weighting may also be advantageous.

Figure 3:
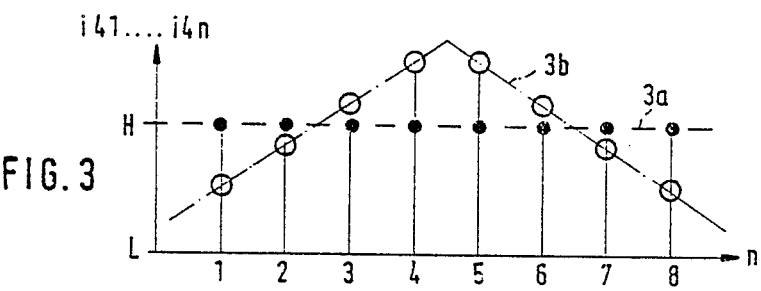
FIG. 3 shows schematically an example of the weighting of the state signals, which are dependent on the shift register.

FIG. 3 shows a weighting characteristic for the eight state signals i41 . . . i48 of an eight-stage shift register. The characteristic rises linearly from the first to fourth state signals i41 . . . i44 and falls linearly from the fifth to eighth state signals i45 . . . i48, with the values of the two middle state signals i44 and i45 being equal. The weighting characteristic for the H level is thus triangular, without changing the arithmetic mean of all eight state signals i41 . . . i48, however.

FIG. 4a–4d illustrate the basic operation of a circuit arrangement according to the invention by seven typical signal waveforms. As shown in FIG. 4a, the clock signal cl is a square-wave signal with a 1:1 mark/space ratio. As shown in FIG. 4b the leading or trailing edge of the PDM signal pm and, hence, the leading or trailing edges of the two feedback signals i3, i4 are coupled with the leading edge of the clock signal cl. If the leading edge of the clock signal cl appears too early of too late, i.e., with jitter, the associated edges of the PDM signal pm and the two feedback si i3, i4 will also exhibit jitter, as is shown in FIG. 4b the instants t1, t2, and t3. The jittering clock-signal edge at the instant t4 does not act on the PDM signals pm since the latter does not change its state at the instant t4.

The hatched areas in the PDM signal pm, which is normalized to the amplitude "1", thus falsify the averaging as first error areas ds1. If the integration times are long, e.g., due to long integration time constants, these errors partly average out. For example, a delayed leading edge at the instant t1 can partly compensate for a premature leading edge at the instant t3. Because of the longer time constant h the averaged signal pa (not shown in FIGS. 4c–4d can no longer change its state quickly, so that its maximum upper cutoff frequency is reduced.

A shift register with four equally weighted state signals i41 . . . i44, which is assumed in FIG. 4c, already clearly reduces the influence of the jittering clock signal cl. In FIG. 4c, the four state signals i41 . . . i44 are drawn one below the other, each delayed by one clock period with respect to the other. The amplitude of each of the four state signals i41 . . . i44 is only one quarter of the amplitude of the original external feedback signal i4, so that in both cases, the sum signal i4s produces the average signal pa of the same magnitude at the integrator j. The jitter-induced error of the four state signals i41 . . . i44 are shown as hatched, second error area ds2.

The last waveform shown in FIG. 4d is the sum signal i4s, which results from the addition of the four state signals i41 . . . i44. The jittering clock-signal edges cause jittering edges in the sum signal i4s, each of whose third error areas ds3 is only one fourth of the first error area ds1 of the PDM signal pm, because, as a result of the addition of the four state signals i41 . . . i44, at the instant t1, for example, the error area ds2 of the second state signal i42 is compensated by the equally large error area ds2 of the first or third state signal i41, i43 Therefore, there remains only one of these second error area ds2, which thus forms the third error area ds3 of the sum signal i4s. The error area in the sum signal i4s at the instant t2 forms in a similar manner.

At the instant t3, the sum signal i4s remains constant, so that the jittering clock signal cl has no effect although the PDM signal pm has a jittering rising edge. No change of state occurs in the PDM signal pm at the instant t4 during the jittering clock-signal edge. Nevertheless, the sum signal i4s shows a positive level change whose value is one quarter of the normalization value and whose third error area ds3 is equal to that at the instant t1. The four state signals i41 . . . i44 show that at the instant t4 there are two positive edges and one negative edge, so that the edge with the second error area ds2 is left.

FIGS. 5a–5d show a fourth error area ds4, which interferes with the averaged signal pa during the averaging in the integrator j. This results from the different slopes of the rising and trailing edges of the state signals i4i. The waveform of FIG. 5a shows one of the state signals i4i which changes its state with each clock period. For the sake of clarity, the rising edge is shown considerably steeper than the trailing edge. Therefore, at the instant of the trailing edge, the pulse area effective during integration is enlarged by the fourth error area ds4 (shown hatched). This fourth error area ds4 occurs whenever the signal changes from the H level to the L level.

The average value of a signal as shown in FIG. 5a, for example, which changes after every clock period, is different from that of a signal as shown in FIG. 5b, which changes after every two clock periods. In the first case of FIG. 5a, twice as many fourth error areas ds4 enter into the averaging than in the second case of FIG. 5b. Unlike the case of the three clock-signal-dependent error areas ds1, ds2, ds3, in FIGS. 4b, 4c and 4d, respectively, the edge-dependent fourth error areas ds4 of FIGS. 5a and 5d never average out.

This is remedied by an isolation of the respective signal state by the return-to-zero method, because during each clock period the signal returns to a basic state regardless of its respective state. The number of fourth error areas ds4 is thus dependent only on the number of H states, not on the order of these states.

The waveform of FIG. 5d shows signal states for seven clock periods which have four H levels, so that four of the fourth error areas ds4 are present. The L level is identical with the level of the "isolation38 . The time for which the state signal i4i remains in its respective state is determined by the gate signal g', illustrated in the waveform of FIG. 5c. The state signals i4i shown in the waveforms in FIGS. 5b and 5d have the same data sequence, but in the waveform of FIG. 5d, the state signal i4i has been passed through a gate circuit controlled by the gate signal g'.

FIG. 6 shows a simple embodiment of gate circuit g, gs to produce the state signal i4i illustrated by the waveform of FIG. 5d. The gate circuit g, gs, which requires only a few additional components, can be added to each stage of the two-phase-clock-controlled shift register, whose stages sr1, sr2 . . . are implemented, for example, with alternate master flip-flops mf and slave flip-flops sf.

The Q and Qq outputs of a first master flip-flop mf in the first shift register stage sr1 are connected to the bases of a first NPN transistor s1 and a second NPN transistor s2, respectively. The emitters of the first and second NPN transistors s1, s2, are connected together and the junction point of the emitters is coupled to the collector of a third NPN transistor s3. The base of the third transistor s3 is controlled by an inverted clock signal clq that has the opposite logic levels from the clock signal cl. The emitter of the third transistor s3, together with the emitter of a fourth NPN transistor s4, is connected to a grounded first current source q1, which supplies the current of the first state signal ii1. The first current source q1 is actually a constant-current sink. The base of the fourth NPN transistor s4 is controlled by the clock signal cl, which is also applied through a delay circuit dt to the clock input of the first master flip-flop mf. The collectors of the second NPN transistor s2 and the fourth NPN transistor s4 are connected to a positive potential, which assumes the value of the current from the first current source q1 when the respective transistor is ON. The collector of the first NPN transistor s1 feeds the summer k3, drawn in FIG. 6 as a busbar, with the first state signal modified by the gate circuit g, i.e., the state signal ii'1.

The gate circuit gs connected to the slave flip-flop sf of the second shift register stage sr2 is identical in construction to the above-described gate circuit g except that the base of the third NPN transistor s3' is connected to the clock signal cl, and the base of the fourth NPN transistor s4' is connected to the inverted clock signal clq. A second constant current source q2 delivers the current of the second state signal ii2. The second state signal ii2 is passed through the gate circuit gs. The output of the gate circuit gs is a modified second state signal ii'2 which is fed to the summer k3. The output of the summer k3 is the sum signal i6s.

The next shift register stage sr3 is again a master flip-flop mf with an associated gate circuit g, such as was described above. The associated gate circuit g is connected to a third constant-current source q3 to provide the current of a third state signal ii3 for the modified third state signal ii'3. These modified state signals ii'1, ii'2 . . . are weighted by setting the current yield of the respective constant-current source.

By means of the delay circuit dt, the respective shift signal is shifted within a clock period by approximately the amount required to implement the ON state of the gate circuit g, gs in the steady state of the respective shift register stage.

The delay circuit dt may comprise a small number of series-connected inverters, for example. The exact value of the delay is not critical, but the individual delay times should be the same. This simple measure eliminates the need for a separate gate signal g' as shown in FIG. 5c.

The embodiment of the gate circuit g, gs of FIG. 6 uses NPN transistors as gate elements. The gates may also, of course, be implemented with field-effect transistors, and their arrangement may be different.

FIGS. 7a–7f show the waveforms of six typical signals of the circuit arrangement of FIG. 6. The first two waveforms in FIGS. 7a and 7b represent the clock signal cl and the inverted clock signal clq. The next two waveforms in FIGS. 7c and 7d are those of the signals p1 and p2 at the Q outputs of the first and second shift register stages sr1 and sr2, namely the master flipflop mf and the slave flip-flop sf, respectively. The oblique signal edges represent the transient times of the individual shift register stages. As a result of the time delays dt', the rising or trailing edges are shifted to the point that the clock signal cl or the inverted clock signal clq lies in the middle of the steady-state period of the output signals p1, p2. The range of the first or second gate time g1, g2 is marked by an oblique hatching. The two associated modified state signals ii'1 and ii'2 are shown in FIGS. 7e and 7f.

This manner of gating is also insensitive to jittering antiphase clock signals. For example, if one gate time has become too long as a result of an widened clock pulse, the corresponding gate time in the subsequent shift register stage will be shortened by the same difference value. The compensation then takes place via the sum signal i6s. This special advantage is illustrated in FIGS. 7a–7f at the instant t5. The delayed edges of the antiphase clock signals cl, clq cause a lengthening and a corresponding shortening of the pulses in the first modified state signal ii'1 and the second modified state signal ii'2, respectively. The pulse lengthening and pulse shortening compensate each other during summation (not shown).

Figure 8:
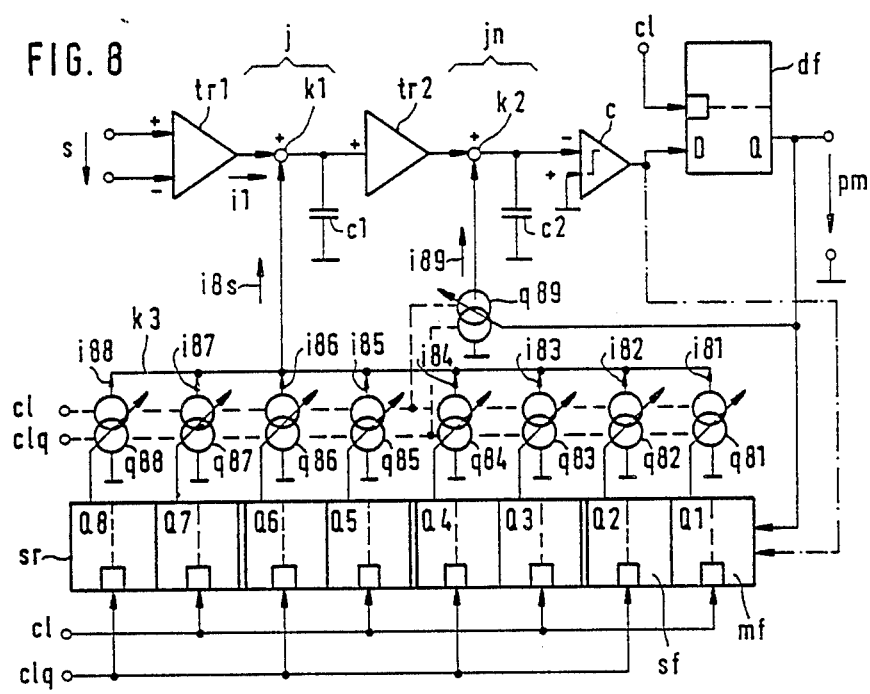
FIG. 8 is a block diagram of a pulse-density A/D converter whose external PDM-signal feedback loop is implemented with the circuit arrangement according to the invention.

FIG. 8 shows a block diagram of a pulse-density A/D converter which includes another, simplified embodiment of the circuit for averaging PDM signals. The basic structure of the A/D converter is similar to that of the pulse-density A/D converter wa of FIG. 1. The external feedback loop for the PDM signal pm includes the averaging circuit according to the invention. The eight-stage shift register sr comprises alternately positioned series-connected master and slave flip-flops mf, sf. The shift signal is the antiphase clock signal cl, clq as in FIG. 6. The delay circuits dt, which may be necessary, are not shown. Eight state signals i81 . . . i88 are formed by eight controlled constant-current sources q81 . . . q88, whose control inputs are connected to the Q outputs Q1 to Q8 of the associated shift register stages.

Figure 9:
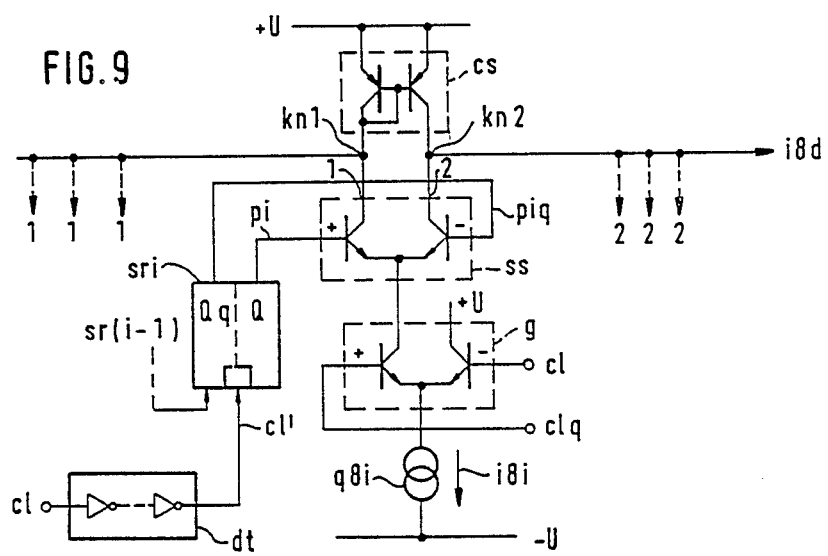
FIG. 9 shows schematically another embodiment of the gate circuit.

An embodiment of the gate circuit for each state signal i81 . . . i88 is shown in FIG. 9, and will be described in more detail below. The gate signals are the antiphase clock signals cl, clq, which are applied as two control signals to the controlled current sources q81 . . . q88 in the simplified representation of FIG. 8. The summer k3 is the busbar for the eight state signals i81 . . . i88, which are fed as the sum signal i8s to the first node k1. The first node k1 is also fed with the intermediate signal i1, which is derived in this embodiment from the analog input signal s by a first transconductance amplifier tr1.

The integrator j, which includes the first capacitor cl, has ideal integration characteristics, for it is driven exclusively via high-impedance current sources. The output voltage of the integrator j, which can be taken across the first capacitor c1, is converted by means of a second transconductance amplifier tr2 into a directly proportional current, which is fed to the second node k2. The second node is also fed with a current i89 from a ninth controlled constant-current source q89, whose control input is presented with the PDM signal pm.

Connected to the second node k2 is the second capacitor c2 and the inverting input (−) of the comparator c, whose noninverting (+) input is grounded. Thus, the sigma-delta integrator jn also represents an integrator with ideal characteristics, because it is supplied only from high-impedance current sources.

As in FIG. 1, the output of the comparator c feeds the D input of the D flip-flop df, whose Q output provides the PDM signal pm and whose clock input is fed with the noninverted clock signal cl. Since, strictly speaking, the PDM signal is already provided by the output of the comparator c, the shift register sr may also be connected to the output of the comparator c instead of the output of the D flip-flop df. This is shown in FIG. 8 by a dash-dot line. In that case, the averaging in the shift register sr is advantageously performed one clock period earlier. This also simplifies the circuit arrangement, because the function of the D-flip-flop df can then be performed by the first shift register stage, whose Q output Q1 then controls the internal feedback signal i89 and provides the PDM signal pm.

FIG. 9 shows the circuit diagram of an embodiment of one of the controlled constant-current sources of FIG. 8. The respective state signal i81, i82 ... is a current which can assume three different levels: a positive level, a negative level of the same magnitude, and a level with the value 0 (zero). This is implemented with the difference-current-generating circuit shown.

One of the shift register stages sri is clocked with the delayed clock signal cl', which is obtained by delaying the clock signal cl by means of a small number of series-connected inverters in the delay circuit dt. The state of the shift register stage sri is controlled by the preceding shift register stage sr(i−1). This is indicated by the dashed signal lead to the input of the shift register stage sri. The noninverted signal pi from the Q output and the inverted signal piq from the Qq output drive the noninverting (+) and inverting (−) inputs, respectively, of the difference stage ss, which comprises two emitter-coupled NPN transistors.

The junction point of the two emitters of the difference stage ss is coupled to the output of the gate circuit g, which also contains a difference stage comprising two emitter-coupled NPN transistors. The clock signal cl is applied to the inverting input (−), and the antiphase clock signal clq to the noninverting input (+) of the gate circuit g. If the antiphase clock signal clq is positive, the gate circuit g is ON and the constant-current source q8i, which is connected to the junction of the emitters of the two NPN transistors, supplies its current i8i to the output of the gate circuit g.

In the embodiment shown, which uses NPN transistors, the constant-current source Q8i is actually a constant-current sink. The output of the gate circuit g is the collector of the switching transistor whose base is fed with the antiphase clock signal clq. The collector of the other switching transistor is coupled to a positive supply line +U, so that it establishes the necessary conductive connection between the constant-current source q8i and a positive potential when the gate circuit g is OFF.

The difference stage ss can also be regarded as an electronic switch whose "contact" is connected to the output of the gate circuit g and whose first output 1 is connected to the "contact" when the Q output of the associated flip-flop sri is more positive than the Qq output, whereas a second output 2 is connected to the "contact" when the Qq output of the flip-flop sri is more positive than the Q output.

The first output of the difference stage ss is connected via a first node kn1 to the input of a current mirror cs, and the second output 2 of the difference stage ss is connected via a second node kn2 to the output of the current mirror cs. The current mirror cs is shown as a simple current-mirror circuit comprising two PNP transistors whose emitters are connected to the positive supply line +U and whose bases are connected together. The junction point of the two bases is coupled to the collector of one of the PNP transistors, and, together with this collector, forms the input of the current mirror cs. The collector of the other PNP transistor forms the output of the current mirror cs.

Instead of assigning to each shift register stage sri a current mirror cs of its own, it is better to provide only a single current mirror cs for all the shift register stages sri. The summation of the currents from all first and second outputs 1, 2 of all difference stages ss takes place in the first node kn1 and the second node kn2, respectively, so that the total resultant difference current i8d can be taken from the second node kn2. The requirements placed on the current mirror cs are thus reduced by the preceding summation and, thus, averaging. This reduction occurs because, instead of the full PDM signal steps, only the much more slowly changing average is fed to the current mirror cs.

FIGS. 10a–10e five typical signal waveforms of the circuit arrangement of FIG. 9 in a timing diagram. The first two waveforms FIGS. 10a and 10d represent the clock signal cl and the associated inverted or antiphase signal clq. The unity mark-space ratio shown is especially suited for clocked shift register stages. Other signals, such as multiphase nonoverlapping clock signals (not shown), are used where edge-triggered or dynamic shift register stages are employed.

FIG. 10e illustrates the waveform for the delayed clock signal cl', whose leading edge may change the output state of the respective shift register stage. The waveform for the noninverted output signal pi is shown in FIG. 10d as an assumed pulse sequence for a few clock-pulse sequences. The last waveform in FIG. 10e represents the associated difference current i8d for a single gate circuit g. This current contains a time sequence of positive or equally large negative current pulses depending on the state of the shift register stage, with the ON period being the same in all cases. Since the ON state of the gate circuit g is controlled by the low level of the clock signal cl or by the high level of the antiphase clock signal clq, the onset and duration of the pulses of the difference current i8d are synchronous with these clock-signal phases.

FIG. 11 shows a particularly advantageous development of the circuit arrangement according to the invention in which the first transconductance amplifier tr1, together with further subcircuits, processes both the intermediate signal and the sum signal as difference signals and forms therefrom a resultant difference signal for driving the integrator j.

The first transconductance amplifier tr1 comprises a first transconductance stage w1 and a second transconductance stage w2. The analog input signal to be converted s is applied as a difference signal to a first input terminal e1 of the first transconductance stage w1 and to a second input terminal e2 of the second transconductance stage w2. The first and second transconductance stages w1 and w2 are constructed like single impedance converters. Like impedance converters, each of the transconductance stages w1 and w2 has a low-impedance NPN emitter-follower output via which the transconductance can be adjusted by means of a pair of resistors R1, R2. The collector terminal of the NPN emitter follower of each transconductance stage w1 and w2 provides a respective high-impedance current-sink output k6, k7 of the transconductance stage w1, w2. Unlike the connection in an impedance converter, each of the transconductance stages w1, w2 is connected to the positive supply terminal +U. Thanks to the great amount of internal negative feedback in the impedance-converter arrangement, distortion in the transconductance stages w1, w2 is kept particularly low. Furthermore, at a constant alpha gain of the NPN emitter followers, the finite value of this gain enters into the transconductance only as a fixed quantity.

The high-impedance difference output of the first transconductance amplifier tr1 is formed by the first high-impedance output terminal k6 of the first transconductance stage w1, which provides the first output current i4, and by the second high-impedance output terminal k7 of the second transconductance stage w2, which provides the second output current i5. The difference of these two currents i4, i5 is directly proportional to the analog input signal s. This proportionality is achieved by the series connection of the two equal-value resistors R1, R2, which connect the low-impedance first output terminal k4 of the first transconductance stage w1 with the low-impedance second output terminal k5 of the second transconductance stage w2. The potentials of the first output terminal k4 and the second output terminal k5 are identical with those of the first input terminal e1 and the second input terminal e2, respectively. The junction of the two resistors R1, R2 is connected to a negative supply line −U through a current sink which draws a constant current Io.

The analog input signal s produces between the first and second low impedance output terminals k4, k5 an input difference current isd which is dependent both on the magnitude of the analog input signal s and on the values of the two resistors R1, R2.

When the potential at the first input terminal e1 is higher than that at the second input terminal e2, the first terminal current I4 at the first high-impedance output terminal k6 is equal to one-half of the constant current Io plus the value of this input difference current isd; and the second terminal current I5 is equal to one-half of the constant current Io reduced by the value of the input difference current isd.

In the circuit shown, the first and second high-impedance output terminals k6, k7 represent current-sink terminals for the first terminal current I4 and the second terminal current I5, respectively. Connected in the form of further current sinks to the first and second high-impedance output terminals k6, k7 are the leads for an inverted sum signal siq and a noninverted sum signal si, respectively, which are dependent on the potentials at the inverting outputs Q1q . . . 8q and the noninverting outputs Q1 . . . Q8, respectively, of the eight shift register stages assumed herein.

The noninverted and inverted sum signals si, siq can be generated in a similar manner as in the circuit arrangement of FIG. 6. It is only necessary to connect the collectors of all NPN transistors s2 connected to the Qq outputs of the shift register stages to an additional busbar, not to a positive reference potential as shown. In FIG. 11, the inverted sum signal siq corresponds to the current on the additional busbar, and the noninverted sum signal si corresponds to the sum signal i6s in FIG. 6.

The generation of the resultant difference current, which is obtained by taking the difference of the currents of the first and second high-impedance output terminals k6, k7, could be easily implemented with a PNP current-mirror circuit similar to that in FIG. 9 if the cutoff frequency and current yield of PNP transistors were sufficient. As a rule, however, neither is the case, although the currents are averaged and subtracted one from the other before being mirrored, which reduces the requirements.

As a solution, FIG. 11 shows a control circuit with a differential amplifier dv, whose low-impedance output terminal k8 feeds the first and second high-impedance output terminals k6, k7 with source currents I6, I7 of equal magnitude. The equality of the two source currents I6, I7 is forced by two equal-value current-source resistors R3, R4, across which the same voltage drops. This is implemented by connecting the low-impedance output terminal k8 of the differential amplifier dv to the first high-impedance output terminal k6 via the first current-source resistor R3 and to the second high-impedance output terminal k7 via the second current-source resistor R4.

The same voltage drop across these two current-source resistors R3, R4 is achieved by means of the voltage control circuit comprising the differential amplifier dv as the essential subcircuit. The inverting input of this differential amplifier is connected to the first high-impedance output terminal k6, and the noninverting input to the second high-impedance output terminal k7. A difference voltage at the input of the differential amplifier dv causes the potential at the output terminal k8 to be adjusted until the difference at the input of the differential amplifier dv is zero. Hunting is prevented by the resistance-capacitance section RC in the control circuit.

In the zero-difference condition, the first source current I6 is equal to the sum of the first terminal current I4 and the current of the inverted sum signal siq. The resultant difference current id at the high-impedance output terminal k7 is exactly the difference formed from the second source current I7 and the sum of the second terminal current I5 and the current of the noninverted sum signal si. The resultant difference current id is thus exactly equal to the input difference current isd. It is fed through the first node k1 to the first capacitor c1, which acts as the integrator j.

In order that the low-impedance output terminal k8 of the differential amplifier dv can also realize fast variations of the resultant difference current id, the usual PNP transistors are replaced with p-channel field-effect transistors, which permit fast current-mirror circuits connected as active loads, which ensure high gain. The high-impedance output of the active load is connected to the input of two series-connected NPN emitter followers having their low-impedance output connected to the output terminal k8.

The differential-amplifier transistor pair is connected to the active load via two NPN transistors used in a cascode configuration and having their bases connected together. The junction point of the two bases is connected to a first fixed potential U1. A second fixed potential U2 is connected to the bases of two further NPN cascode transistors through which the inverted and noninverted sum signals siq, si are transferred to the first high-impedance output terminal k6 and the second high-impedance output terminal k7, respectively.

FIG. 11 shows simple embodiments of the first and second transconductance stages w1, w2, which are identical in construction. The two transconductance stages w1, w2 each include a difference stage in the input which comprises a first NPN transistor and a second NPN transistor having their emitters coupled together. The junction point of the two emitters is connected via a current source to the negative supply line −U. The base of the first NPN transistor in the first transconductance stage w1 and the base of the first NPN transistor in the second transconductance stage w2 are connected to the first input terminal e1 and the second input terminal e2, respectively. The base of the second NPN transistor in the first transconductance stage w1 and the base of the second NPN transistor in the second transconductance stage w2 are connected to the low-impedance first output terminal k4 and the low-impedance second output terminal k5, respectively. The low impedance output terminals k4 and k5 are each formed by the emitter of a respective third NPN transistor connected as an emitter follower.

As in the differential amplifier dv, the necessary high gain in the two transconductance stages w1, w2 is achieved by means of a respective p-channel current-mirror circuit connected as an active load. The input of the p-channel current-mirror circuit is connected to the collector of the first NPN transistor, and the output of the p-channel current-mirror circuit is coupled to the collector of the second NPN transistor and to the base of the third NPN transistor. The emitters of the third NPN transistors in each of the transconductance stages w1 and w2 thus form the low-impedance first output terminal k4 and the low-impedance second output terminal k5, respectively, which are connected to the same potential as the first input terminal e1 and the second input terminal e2, respectively, while the high-impedance first and second output terminals k6, k7 are formed by the collectors of the third NPN transistors. The source terminals of the two p-channel transistors are coupled together, and the junction point is connected to the positive supply line +U.

What is claimed is:

1. A circuit that averages a pulse-density-modulated signal, comprising;
   a shift register having n stages, said shift register having a serial input and a clock input, and having an output from each of said n stages, said serial input being fed with said pulse-density-modulated signal, said clock input being fed with a clock signal;
   a summer fed with n state signals, each of said state signals being assigned to and dependent on the state of the output of one of said n shift register stages, said summer providing a sum output signal responsive to said state signals; and
   a low-pass filter having an input and an output, said input connected to the sum output from said summer, said low-pass filter providing the averaged signal at its output.

2. A circuit as defined in claim 1, wherein said low-pass filter comprises a first-order integrator, and wherein said circuit comprises:
   a sigma-delta modulator having an input and an output, said input being connected to the output of said first-order integrator, said output coupled to said serial input of said shift register; and
   means for deriving an intermediate signal from said analog input signal and feeding said intermediate signal to said input of said integrator together with said sum output signal, said means comprising components having values selected to set the time average of the value of the sum signal oppositely equal to the time average of the value of the intermediate signal.

3. A circuit as defined in claim 1, further comprising a source of an additional signal having a constant magnitude, said additional signal being applied to said input of said low-pass filter.

4. A circuit as defined in claim 1, wherein said state signals have weighting characteristics, and wherein said state signals are assigned the same weight.

5. A circuit as defined in claim 1, wherein said state signals have weighting characteristics, and wherein said state signals are weighted differently in such a manner that the arithmetic mean of the n state signals which are in the same state is equal to the value of a single state signal if said state signals had the same weight.

6. A circuit as defined in claim 5, wherein the weighting characteristic for the n state signals rises and falls linearly symmetrically with respect to the middle state signal when the number n of said state signals is odd, and symmetrically with respect to the two middle state signals when the number n of said states signals is even.

7. A circuit as defined in claim 1, wherein:
   said n state signals are fed as single pulses to the summer through respective gate circuits having ON times and OFF times for each of said n state signals, said ON times selected so that the state signals are gated through said gate circuits when said state signals are in respective steady state conditions at the output of the associated shift register stage; and
   said ON times for said gate circuits are equal to one another.

8. A circuit as defined in claim 7, further comprising a delay circuit, and wherein:
   said shift register is operated with a multiphase clock signal which is applied to the respective shift register stage via said delay circuit after being delayed by a fraction of the clock period in said delay circuit; and
   wherein said multiphase clock signal serves as a gating signal for said gate circuits.

9. A circuit as defined in claim 8, wherein, when said gate circuits are ON, each of the n state signals assumes a positive value in the first state of the respective shift register stage and an equal negative value in the second state of the respective shift register stage, an wherein, when said gate circuits are OFF, each of the n state signals assumes the value 0.

10. A circuit arrangement as defined in claim 9, further comprising a first transconductance amplifier that derives said intermediate signal from said analog input signal.

11. A circuit arrangement as defined in claim 10, wherein:
said first transconductance amplifier has a first high impedance output terminal and a second high impedance output terminal, said first transconductance amplifier delivering a first terminal current through said first high-impedance output terminal and delivering a second terminal current through said second high-impedance output terminal, said second high-impedance output terminal connected to said integrator to provide said integrator with a difference current; and
each of said shift register stages has an inverting output and a noninverting output, each having a respective state;
said circuit further comprising:
means for converting said states of said inverting outputs of said shift register stages into an inverted sum signal that is applied to said first high-impedance output terminal;
means for converting said states of said noninverting outputs of said shift register into a noninverted sum signal that is applied to said second high-impedance output terminal;
a differential amplifier having an inverting input connected to said first high-impedance output terminal, a noninverting input connected to said second high-impedance output terminal, and a low-impedance output terminal;
a first current-source resistor having a resistance value, said first current-source resistor having a first terminal connected to said low-impedance output of said differential amplifier and having a second terminal connected to said first high-impedance output terminal; and
a second current-source resistor having substantially the same resistance value as said first current-source resistor, said second current-source resistor having a first terminal connected to said low-impedance output of said differential amplifier and having a second terminal connected to said second high-impedance output terminal.

12. The circuit as defined in claim 10, further comprising a second transconductance amplifier that derives said input signal for said sigma-delta modulator from said output signal of said integrator.

13. A circuit as defined in claim 1, wherein said low-pass filter comprises a first-order low-pass filter, and wherein said circuit comprises:
a sigma-delta modulator having an input and an output, said input being connected to the output of said first-order low-pass filter, said output coupled to said serial input of said shift register; and
means for deriving an intermediate signal from said analog input signal and feeding said intermediate signal to said input of said first-order low-pass filter together with said sum output signal, said means comprising components having values selected to set the time average of the value of the sum signal oppositely equal to the time average of the value of the intermediate signal.

* * * * *